(12) United States Patent
Matsudate et al.

(10) Patent No.: US 8,053,976 B2
(45) Date of Patent: Nov. 8, 2011

(54) ORGANIC EL DISPLAY DEVICE INCLUDING DISPLAY PANEL

(75) Inventors: Noriharu Matsudate, Kujukuri (JP); Takeshi Ookawara, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 203 days.

(21) Appl. No.: 12/216,888

(22) Filed: Jul. 11, 2008

(65) Prior Publication Data
US 2009/0015152 A1   Jan. 15, 2009

(30) Foreign Application Priority Data
Jul. 12, 2007   (JP) ................. 2007-182852

(51) Int. Cl.
*H01L 51/00* (2006.01)
(52) U.S. Cl. ...................... 313/504; 313/506
(58) Field of Classification Search .......... 313/504, 313/506, 500; 427/66
See application file for complete search history.

(56) References Cited

U.S. PATENT DOCUMENTS

| | | | |
|---|---|---|---|
| 2003/0160960 A1* | 8/2003 | Noguchi et al. | 356/401 |
| 2005/0206898 A1* | 9/2005 | Noguchi et al. | 356/400 |
| 2008/0001525 A1* | 1/2008 | Chao et al. | 313/500 |
| 2009/0015523 A1* | 1/2009 | Matsudate et al. | 345/76 |

FOREIGN PATENT DOCUMENTS

| | | |
|---|---|---|
| JP | 2003-297562 | 10/2003 |
| KR | 10-0626282 B1 | 9/2006 |

* cited by examiner

*Primary Examiner* — Karabi Guharay
(74) *Attorney, Agent, or Firm* — Stites & Harbison PLLC; Juan Carlos A. Marquez, Esq.

(57) ABSTRACT

The present invention aims at the suppression of chromaticity irregularities and brightness irregularities by reflecting a result of an analysis of film forming misalignment of an organic EL layer. For this end, a drive circuit chip 6 is mounted on a lower side of a display panel 4, and a terminal portion 7 for connection with an external device (a host device) is mounted on an end edge of the lower side of a display panel 4. Film forming misalignment vectors (indicated by arrows) of sub pixels at an arbitrary point in a display region 5 fall within a first quadrant and an angle made between the vectors falls within 90°.

5 Claims, 5 Drawing Sheets

ORGANIC EL DISPLAY DEVICE INCLUDING DISPLAY PANEL

CROSS-REFERENCE TO RELATED APPLICATIONS

The disclosure of Japanese Patent Application No. 2007-182852 filed on Jul. 12, 2007 including the specification, drawings and abstract is incorporated herein by reference in its entirety.

BACKGROUND OF THE INVENTION

1. Field of the Invention

The present invention relates to an organic EL display device, and more particularly to an organic EL display device which can suppress the chromaticity irregularities and the brightness irregularities by reflecting a result of an analysis of film forming misalignment of an organic EL layer.

2. Description of the Related Art

Different from a liquid crystal display device, a display device which adopts organic EL elements (OLED) does not require a backlight and hence, the display device can realize the reduction of thickness and weight thereof. A color reproduction method of the organic EL element follows the additive color mixing theory based on emission of lights of three primary colors in the same manner as a conventional CRT. Blue(B), green (G) and red (R) dots (pixels: sub pixels in a full-color display) respectively emit lights, and the respective dots possess characteristic spectroscopies in the substantially same manner as the CRT.

The organic EL display device can be classified into a bottom-emission-type organic EL display device and a top-emission-type organic EL display device depending on extracting direction of emitted light. The bottom-emission-type organic EL display device has following advantages.

(1) A substrate can be manufactured using substantially same process as a thin-film-transistor-type liquid crystal display device.

(2) Cathodes in a film shape can be formed easily.

(3) Sealing can be also performed easily.

As a disadvantage of the bottom-emission-type organic EL display device has, an openings of each pixel is restricted attributed to the arrangement of a thin film transistor and hence, a numerical aperture becomes low.

On the other hand, in the top-emission-type organic EL display device, the pixel is not influenced by the arrangement of the thin film transistor and hence, the thin film transistor can be arranged in a pixel region whereby the numerical aperture becomes high. However, the cross-sectional structure of the pixel is complicated and hence, it is necessary to make a sealing can (sealing glass) have the light transmitting property.

Both types of the organic EL display device are constituted by providing a display panel which forms pixels constituted of a plurality of organic EL elements in a matrix array on an active substrate on which thin film transistors are formed and by assembling a peripheral member such as a drive circuit to the display panel. The organic EL element is provided to the active substrate for every unit color pixel which is constituted of a plurality of sub pixels, and is constituted of one electrode in which a sub pixel opening is formed, an organic EL layer which is formed on one electrode, and another electrode which is formed on the organic EL layer while covering the organic EL layer.

In the mass-producing process of the organic EL display devices, a vapor deposition method is often used to form the organic EL layer on the sub pixel opening. Japanese Patent Laid-Open No. 2003-297562 (Patent document 1) discloses a vapor deposition method of forming an organic EL layer on an organic EL panel by masking.

SUMMARY

Organic EL layers of organic EL panels which constitute organic EL display devices are formed by forming an organic EL material which corresponds to a large number of organic EL panels on a large-sized glass (mother glass) by vapor deposition by way of a mask which includes an opening pattern corresponding to openings formed in the sub pixels of the respective organic EL panels. In the vapor deposition method using the mask, misalignment of a film forming position is generated due to the thermal expansion of the mask thus causing chromaticity irregularities and brightness irregularities. In patent document 1, a mask having a size smaller than a size of the mother glass is prepared, and the vapor deposition is performed by moving the mother glass relative to the mask thus suppressing the misalignment of the film forming position attributed to the thermal expansion.

However, the technique disclosed in patent document 1 fails to perform an analysis of a generation mechanism of film forming misalignment and also fails to disclose measures to cope with the above-mentioned film forming misalignment in realizing the commercialization of the product.

Accordingly, it is an object of the present invention to provide an organic EL display device which can suppress chromaticity irregularities and brightness irregularities by reflecting a result of an analysis of film forming misalignment of an organic EL layer.

An organic EL display device of the present invention includes a display panel which is formed by arranging pixels constituted of a plurality of organic EL elements on an active substrate in a matrix array. The organic EL element is provided to the active substrate for every unit color pixel which is constituted of a plurality of sub pixels, and is constituted of one electrode in which a sub pixel opening is formed, an organic EL layer which is formed on one electrode, and another electrode which is formed on the organic EL layer while covering the organic EL layer. Angles made between vectors indicative of misalignments of the film forming centers of respective organic EL layers relative to the centers of the sub pixel openings at an arbitrary position on the display panel fall within 90°.

The organic EL display device of the present invention is also characterized in that lights emitted from the organic EL layers which are formed on the sub pixel openings are constituted of lights of three colors consisting of red, green and blue, and organic EL layers of three colors are formed on the sub pixel openings so as to form the unit color pixel. The organic EL display device of the present invention is also characterized in that angles and magnitudes of the vectors of the organic EL layers of three colors differ from each other.

Further, the present invention is applicable not only a top-emission-type organic EL display device in which one electrode is a reflection electrode and another electrode is a transparent electrode but also a bottom-emission-type organic EL display device in which one electrode is a transparent electrode and another electrode is a reflection electrode.

According to the present invention, it is possible to acquire an organic EL display device which can suppress chromaticity irregularities and brightness irregularities by reflecting a result of an analysis of film forming misalignment of an organic EL layer to the designing of a vapor deposition mask and a vapor deposition process.

DESCRIPTION OF THE PREFERRED EMBODIMENTS

Figure 1:
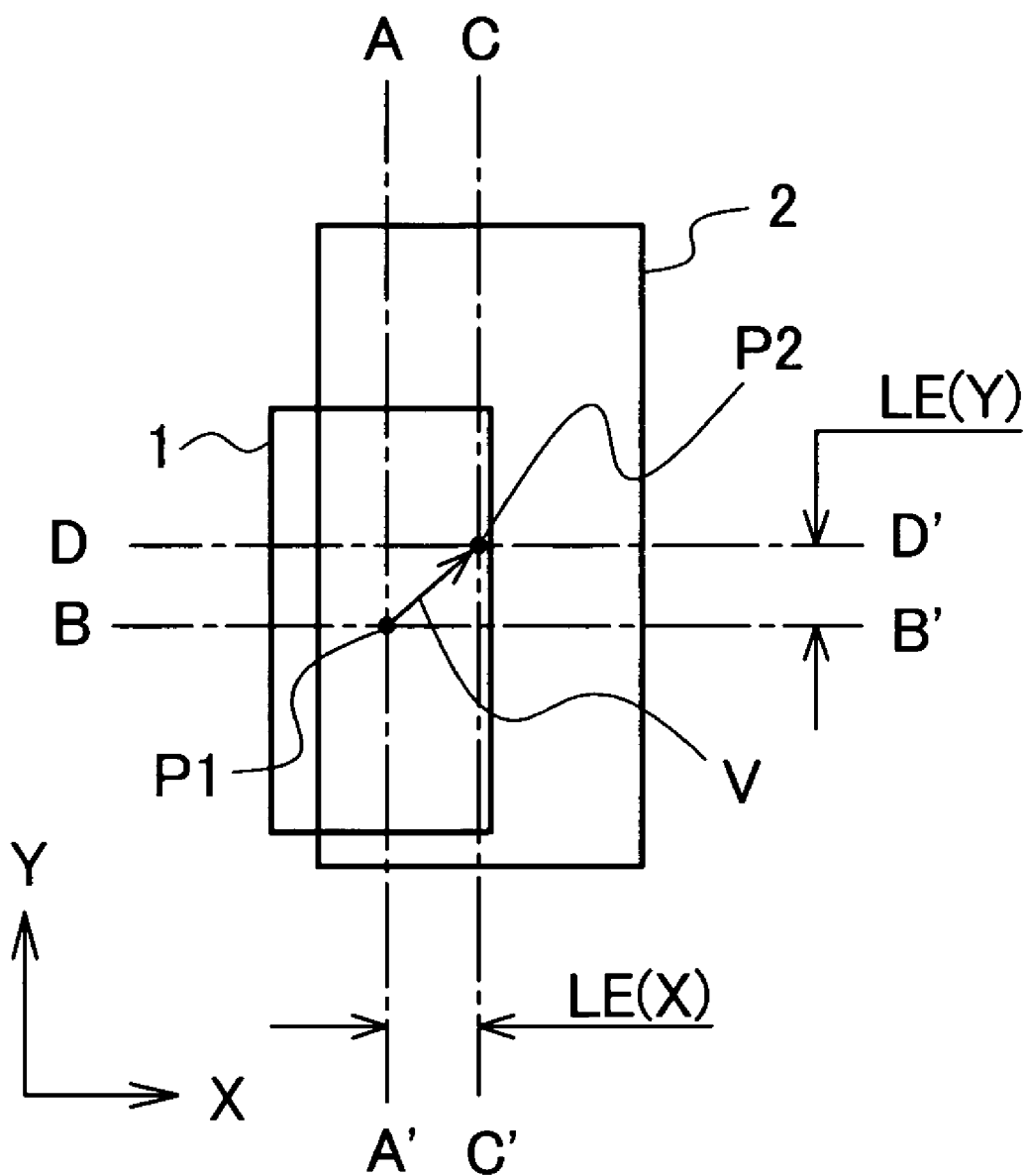
FIG. 1 is a schematic view for explaining the definition of film forming misalignment.

Hereinafter, a preferred embodiment of the present invention is explained in detail in conjunction with attached drawings. First of all, the definition of film forming misalignment is explained in conjunction with FIG. 1. With respect to an organic EL element, a sub pixel opening 1 is formed on an active substrate for every unit color pixel which is constituted of a plurality of sub pixels. An organic EL layer 2 is adhered to the sub pixel opening 1 by vapor deposition. Neighboring three sub pixel openings 1 correspond to three colors consisting of red, green, and blue, and a full-color display is performed by these three colors. In the drawing, symbol X indicates the row direction of a matrix (usually the scanning-line direction), and symbol Y indicates the column direction of the matrix (usually the data-line direction).

To explain the sub pixel opening 1, a line A-A' indicates a center line in the Y direction, a line B-B' indicates a center line in the X direction, and an intersecting point P1 of these liens is the center of the sub pixel opening 1. Further, to explain the organic EL layer 2 which is formed by vapor deposition, a line C-C' indicates a center line in the Y direction, a line D-D' indicates a center line in the X direction, and an intersecting point P2 of these lines is the center of the organic EL layer 2. Film forming misalignment of the organic EL layer 2 is indicated by a vector V which extends to the intersecting point P2 of the organic EL layer 2 from the center P1 of the sub pixel opening 1. The vector V indicates a misalignment quantity (LE(X), LE(Y)) and the misalignment direction of the organic EL later 2 with respect to the sub pixel opening 1.

Embodiment 1

Figure 2:
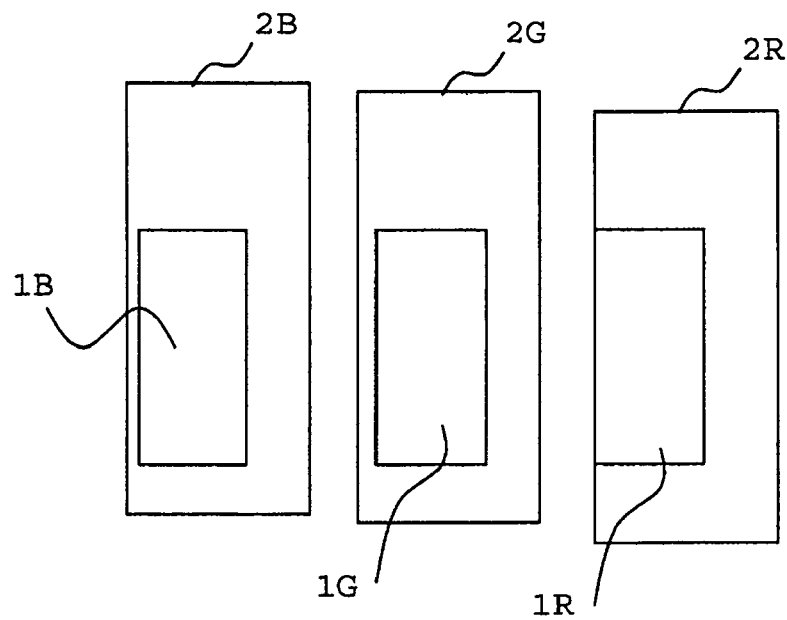
FIG. 2 is a schematic view showing a state of film forming misalignment of an organic EL layer in three-color sub pixel openings for explaining an embodiment of the present invention.
Figure 3:
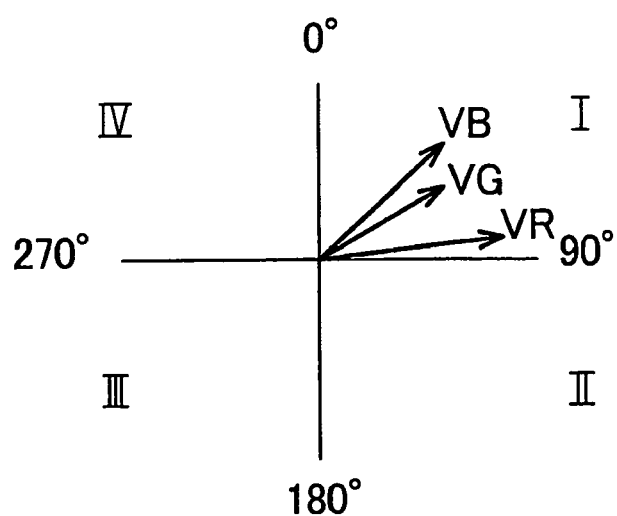
FIG. 3 is a vector diagram showing the film forming misalignment of the organic EL layer in FIG. 2.

FIG. 2 is a schematic view showing a film forming misalignment state of the organic EL layer in the three-color sub pixel openings for explaining the embodiment of the present invention. Further, FIG. 3 is a vector diagram showing the film forming misalignment in FIG. 2. A color pixel for the full-color display includes three color sub pixel openings 1R, 1G and 1B as a unit. In FIG. 2, film forming misalignment at an arbitrary point of the display panel is shown. As shown in FIG. 3, the film forming misalignments of the respective colors differ from each other depending on the thermal expansion of a mask, a distance from the center of the mask and a position of a vapor deposition source. In this example, all film forming misalignment vectors VB, VG and VR of the organic EL layers of three colors are arranged within a first quadrant and angles made between the respective film forming misalignment vectors VB, VG and VR fall within 90°.

Figure 4:
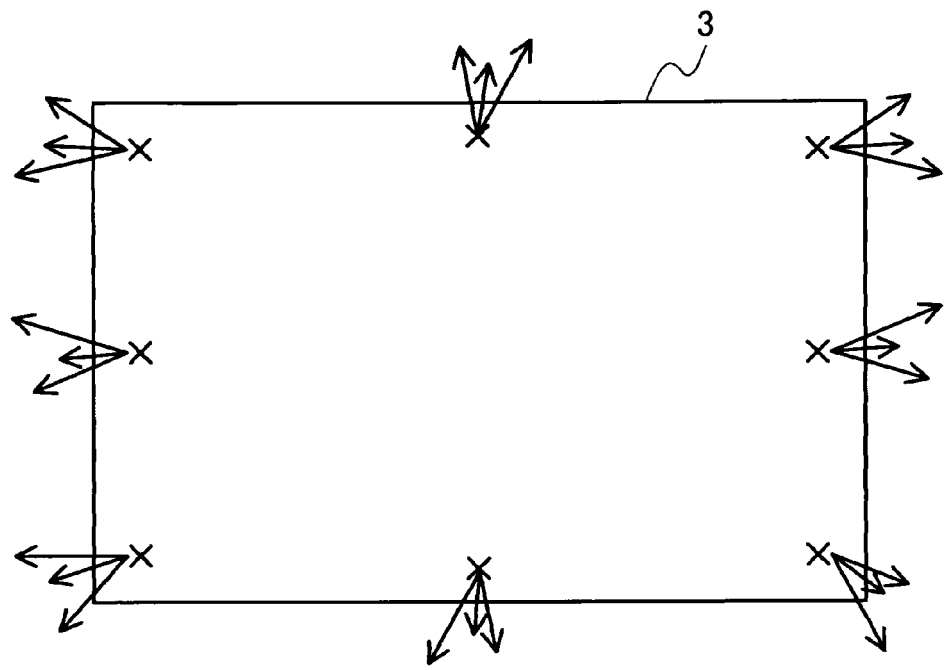
FIG. 4 is a schematic view for explaining an overall image of film forming misalignment vectors on a mother glass board.

FIG. 4 is a schematic view for explaining an overall image of film forming misalignment vectors on a mother glass board. This example shows a case that the film forming misalignment vector distribution by masking is positive, that is, the film forming misalignment vectors are directed toward the outside of the mother glass board 3. In FIG. 4, arrows at respective positions are substantially equal to the arrows shown in FIG. 3.

Figure 5:
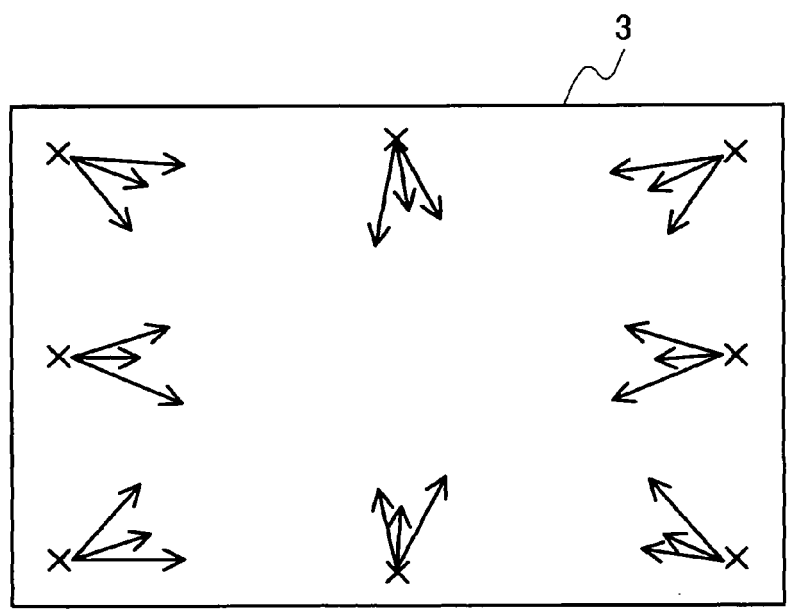
FIG. 5 is a schematic view for explaining another overall image of film forming misalignment vectors on the mother glass board.

FIG. 5 is a schematic view for explaining another overall image of the film forming misalignment vectors on the mother glass board. This example shows a case that the film forming misalignment vector distribution by masking is negative, that is, the film forming misalignment vectors are directed toward the inside of the mother glass board 3. Also in FIG. 5, arrows at respective positions are substantially equal to the arrows shown in FIG. 3.

Figure 6:
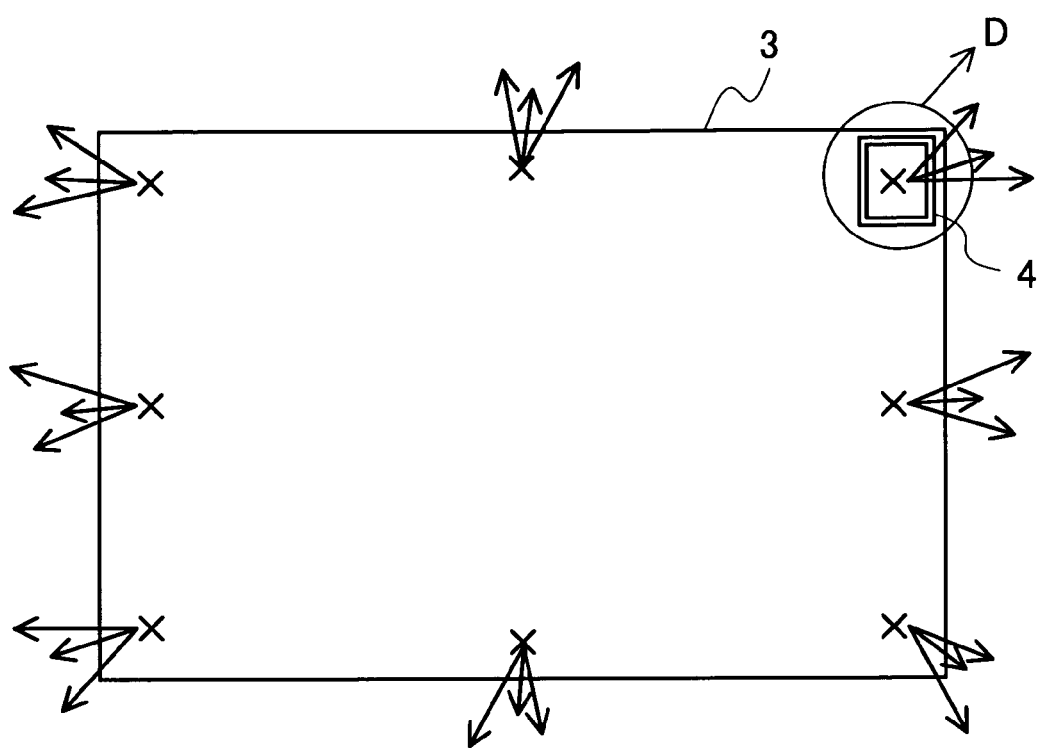
FIG. 6 is a schematic view when a mask having the positive film forming misalignment vector distribution and substantially equal to a mask shown in FIG. 4.
Figure 7:
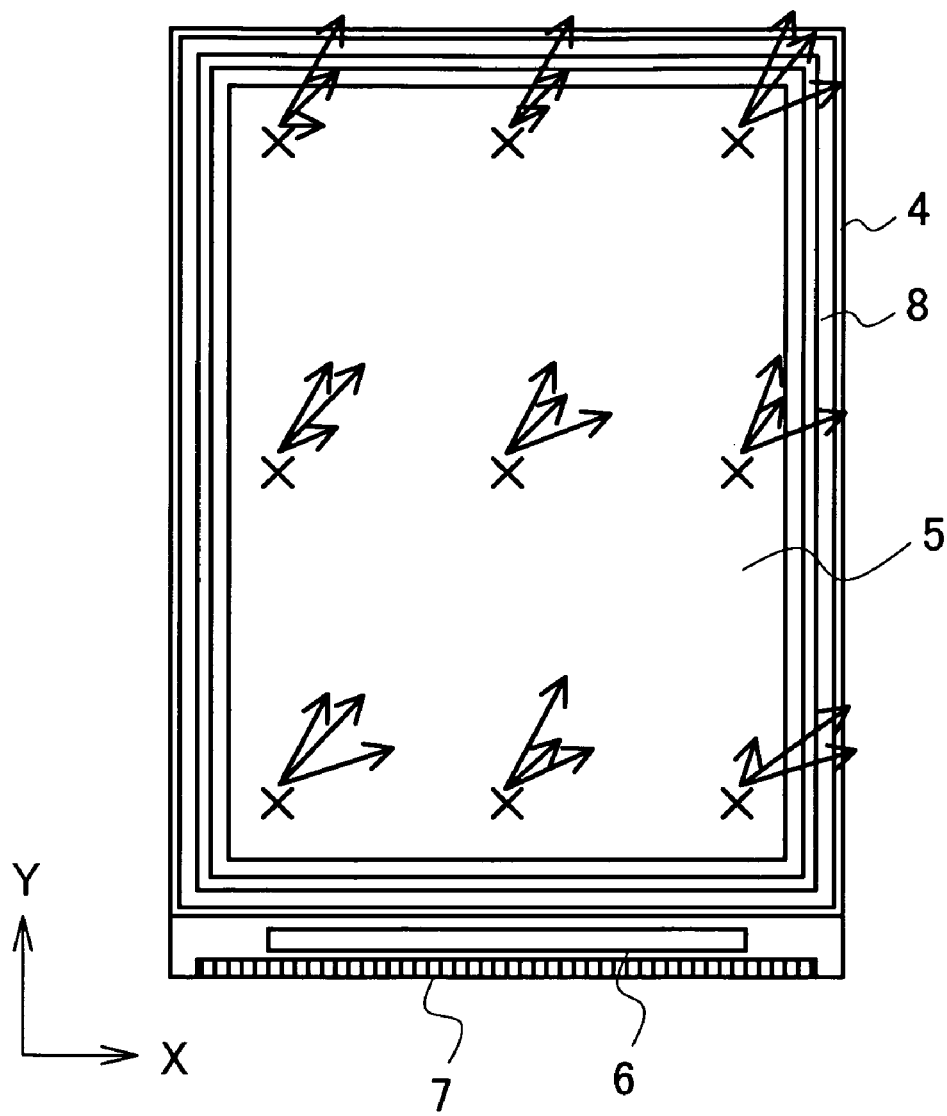
FIG. 7 is an enlarged view of a display panel at a portion of a mother board indicated by a symbol D in FIG. 6.

FIG. 6 is a schematic view when a mask having the positive film forming misalignment distribution and substantially equal to the mask shown in FIG. 4 is used. FIG. 7 is an enlarged view of a display panel at a portion of the mother board indicated by symbol Din FIG. 6. The display panel 4 mounts a drive circuit chip 6 on a lower short side thereof, and a terminal portion 7 is mounted on an edge portion of the short side of the display panel 4 for connection with an external device (a host device). Here, a sealing glass not shown in the drawing is fixed to the display panel 4 using a seal 8. In the display panel 4 at the portion of the mother board indicated by symbol D in FIG. 6, it is found that the film forming misalignment vectors of the sub pixels at an arbitrary point within a display region 5 of the display panel 4 falls within a first quadrant and angles made between the respective film forming misalignment vectors fall within 90°.

On a periphery of the mother glass board, the film forming misalignment vectors remarkably appear in the direction shown in FIG. 6. Tension is uniformly applied to the mask in the X direction as well as in the Y direction respectively. In a center region of the mother glass board except for the center of the mother glass board, with respect to the film forming misalignment vectors, the same tendency is observed as the tendency in the peripheral region although a thermal expansion quantity of the mask in the center region is slightly smaller than the thermal expansion quantity of the mask in the peripheral region. By manufacturing the mask based on such an analysis and by performing the vapor deposition, it is possible to suppress the generation of the chromaticity irregularities and the brightness irregularities.

What is claimed is:

1. An organic EL display device including a display panel which is formed by arranging pixels constituted of a plurality of organic EL elements on an active substrate in a matrix array, wherein the organic EL element is provided to the active substrate for every unit color pixel which is constituted of a plurality of sub pixels, and is constituted of one electrode in which a sub pixel opening is formed, an organic EL layer which is formed on one electrode, and a second electrode which is formed on the organic EL layer while covering the organic EL layer, and said sub pixel opening coordinated on a coordinated system, said coordinate system having an origin, a film forming center of an EL layer coordinated relative to said coordinate system,
said sub pixel opening coordinated on a coordinate system, said coordinate system having an origin,
a film forming center of an EL layer coordinated relative to said coordinate system,
angles made between vectors indicative of misalignments of the film forming centers of respective organic EL layers relative to the centers of the sub pixel openings respectively at an arbitrary position on the display panel fall within an angle value of an angle value of 90°,
wherein a measurement of said angle value is measured keeping the center of the sub pixel opening as the origin of the coordinate system of said measurement.

2. An organic EL display device according to claim 1, wherein lights emitted from the organic EL layers which are formed on the sub pixel openings are constituted of lights of three colors consisting of red, green and blue, and organic EL layers of three colors are formed on the sub pixel openings so as to form the unit color pixel.

3. An organic EL display device according to claim 2, wherein angles and magnitudes of the vectors of the organic EL layers of three colors differ from each other.

4. An organic EL display device according to claim 1, wherein the one electrode is a reflection electrode and the second electrode is a transparent electrode.

5. An organic EL display device according to claim 1, wherein the one electrode is a transparent electrode and the second electrode is a reflection electrode.

* * * * *